United States Patent
Ishikawa

(10) Patent No.: US 10,743,450 B2
(45) Date of Patent: Aug. 11, 2020

(54) COMPONENT SUPPLY UNIT AND MOUNTING DEVICE

(71) Applicant: FUJI CORPORATION, Chiryu-shi (JP)

(72) Inventor: Kazuma Ishikawa, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 45 days.

(21) Appl. No.: 16/087,838

(22) PCT Filed: Mar. 30, 2016

(86) PCT No.: PCT/JP2016/060417
§ 371 (c)(1),
(2) Date: Sep. 24, 2018

(87) PCT Pub. No.: WO2017/168638
PCT Pub. Date: Oct. 5, 2017

(65) Prior Publication Data
US 2019/0090394 A1 Mar. 21, 2019

(51) Int. Cl.
*H05K 13/02* (2006.01)
*H05K 13/08* (2006.01)
(Continued)

(52) U.S. Cl.
CPC ... *H05K 13/0882* (2018.08); *G05B 19/41805* (2013.01); *H05K 13/02* (2013.01);
(Continued)

(58) Field of Classification Search
None
See application file for complete search history.

(56) References Cited

U.S. PATENT DOCUMENTS

| 5,930,140 A | 7/1999 | Asai et al. | |
| 6,449,523 B1 * | 9/2002 | Johnson | H05K 13/08 700/121 |

(Continued)

FOREIGN PATENT DOCUMENTS

| EP | 0 967 851 A1 | 12/1999 |
| EP | 2 523 538 A1 | 11/2012 |

(Continued)

OTHER PUBLICATIONS

International Search Report dated Jun. 28, 2016, in PCT/JP2016/060417 filed Mar. 30, 2016.
(Continued)

*Primary Examiner* — Paul B Yanchus, III
(74) *Attorney, Agent, or Firm* — Oblon, McClelland, Maier & Neustadt, L.L.P.

(57) ABSTRACT

Component supply unit includes supply section for supplying components to mounting device, is electrically connected to mounting device, receives from an operator an operation input to supply section and an operation input to mounting device, controls supply section in accordance with the operation input to supply section, and outputs a signal to mounting device based on the operation input to mounting device. Component supply unit receives the operation input to mounting device in addition to the operation input to component supply unit.

6 Claims, 3 Drawing Sheets

(51) Int. Cl.
*H05K 13/04* (2006.01)
*G05B 19/418* (2006.01)

(52) U.S. Cl.
CPC ............... *H05K 13/0409* (2018.08); *G05B 2219/34215* (2013.01); *G05B 2219/45031* (2013.01)

(56) References Cited

U.S. PATENT DOCUMENTS

| | | |
|---|---|---|
| 6,694,606 B1 | 2/2004 | Ohashi et al. |
| 9,802,286 B2 | 10/2017 | Nishi et al. |
| 2004/0078962 A1 | 4/2004 | Ohashi et al. |
| 2012/0266457 A1 | 10/2012 | Hanamura et al. |
| 2012/0308359 A1 | 12/2012 | Morishima |

FOREIGN PATENT DOCUMENTS

| | | | |
|---|---|---|---|
| JP | 4-317101 A | 11/1992 | |
| JP | 2010-277425 A | 12/2010 | |

OTHER PUBLICATIONS

Extended European Search Report dated Oct. 15, 2019, in Patent Application No. 16896857.6, 8 pages.

\* cited by examiner

COMPONENT SUPPLY UNIT AND MOUNTING DEVICE

TECHNICAL FIELD

The present application relates to a component supply unit and a mounting device.

BACKGROUND ART

Conventionally, there are devices for controlling a robot that supplies and picks up a workpiece, such as a device that includes a portable operation panel for operating a robot control device and displays information of a machine tool on the operation panel via a network cable (see, for example, patent literature 1). Further, there is a device with a function to select another numerical control device from a first numerical control device and implement a function of the CRT/MDI unit of the other numerical control device from the first numerical control device (for example, refer to patent literature 2).

CITATION LIST

Patent Literature

Patent literature 1: JP-A-2010-277425
Patent literature 2: JP-A-H4-317101

BRIEF SUMMARY

Technical Problem

A mounting device for mounting a component on a substrate may include a component supply unit. With such a mounting device, starting, stopping, and the like are generally performed at the mounting device. Further, there are cases in which an operator performs operations at the component supply unit to start the mounting device. With such a mounting device, an operator may want to perform operation input in a smooth manner. In devices described in patent literature 1 and 2, although operation of one device is possible at another device, there may be an ambiguous relationship between the mounting device and a unit included in the mounting device such that the operation target may become unclear or such that the wrong operation target is operated.

The present disclosure has been made in view of such problems and a main object thereof is to provide a component supply unit and a mounting device that enable an operator to operate the mounting device from the component supply unit without operator accessing the mounting device.

Solution to Problem

In order to achieve the above-mentioned main object, the present disclosure adopts the following means.

A component supply unit of the present disclosure is a component supply unit configured to be loaded on a mounting device for mounting a component on a substrate, the component supply unit including:

a supply section configured to supply a component to the mounting device;

a connecting section configured to be electrically connected to the mounting device;

a unit operation panel configured to receive from an operator an operation input to the supply section and an operation input to the mounting device, and a control unit configured to control the supply section in accordance with the operation input to the supply section and to output a signal to the mounting device based on the operation input to the mounting device.

The component supply unit includes the supply section for supplying components to the mounting device, is electrically connected to the mounting device, receives from an operator an operation input to the supply section and an operation input to the mounting device, controls the supply section in accordance with the operation input to the supply section, and outputs a signal to the mounting device based on the operation input to the mounting device. In this manner, with this unit, because it is possible for the mounting device to receive an operation input, the mounting device can be operated from the component supply unit without the operator accessing the mounting device. As a result, the operator can perform operation inputs in a smooth manner.

DESCRIPTION OF EMBODIMENTS

Figure 1:
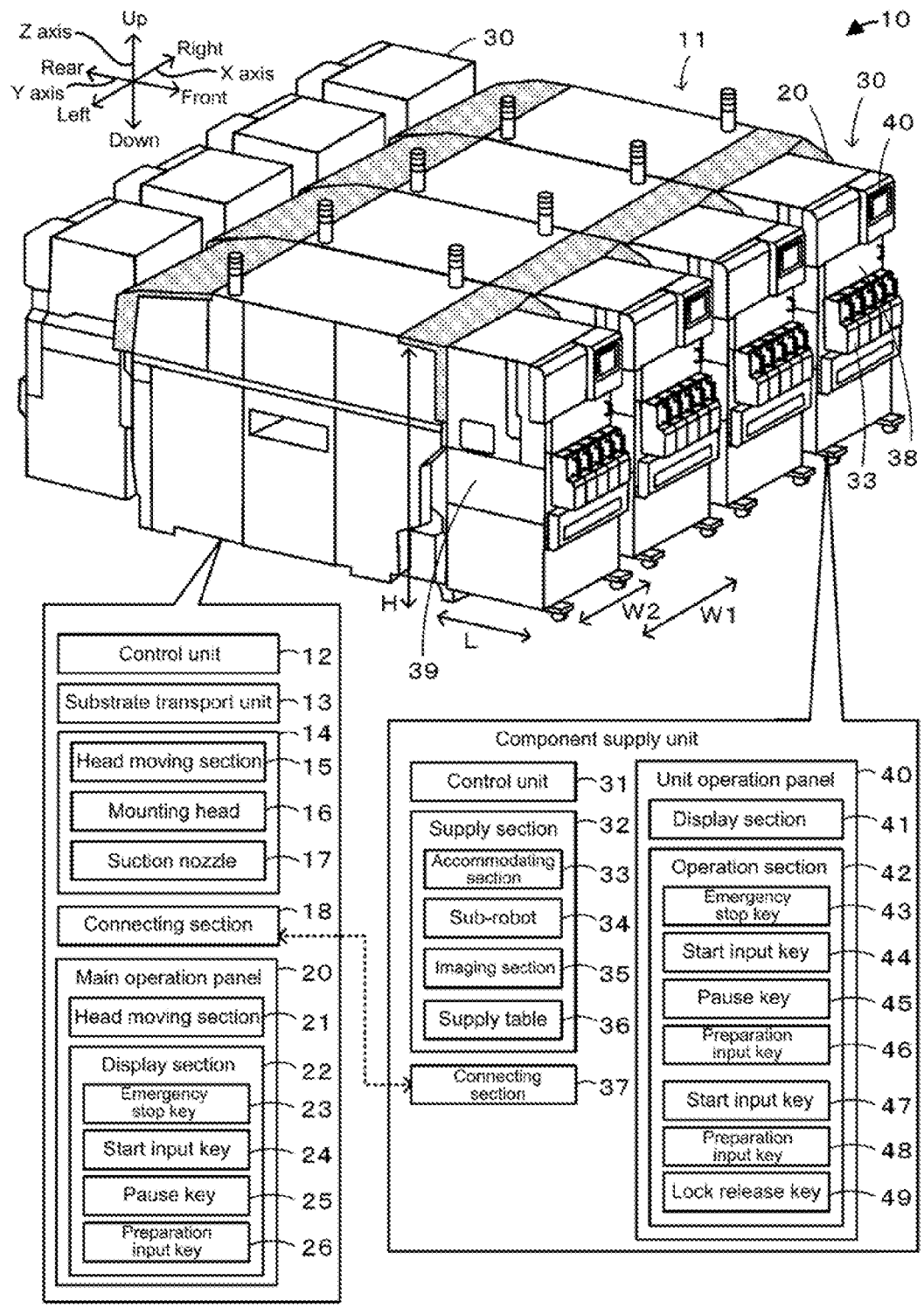
FIG. 1 is a schematic diagram showing an example of a configuration of mounting device 11 and component supply unit 30.
Figure 2:
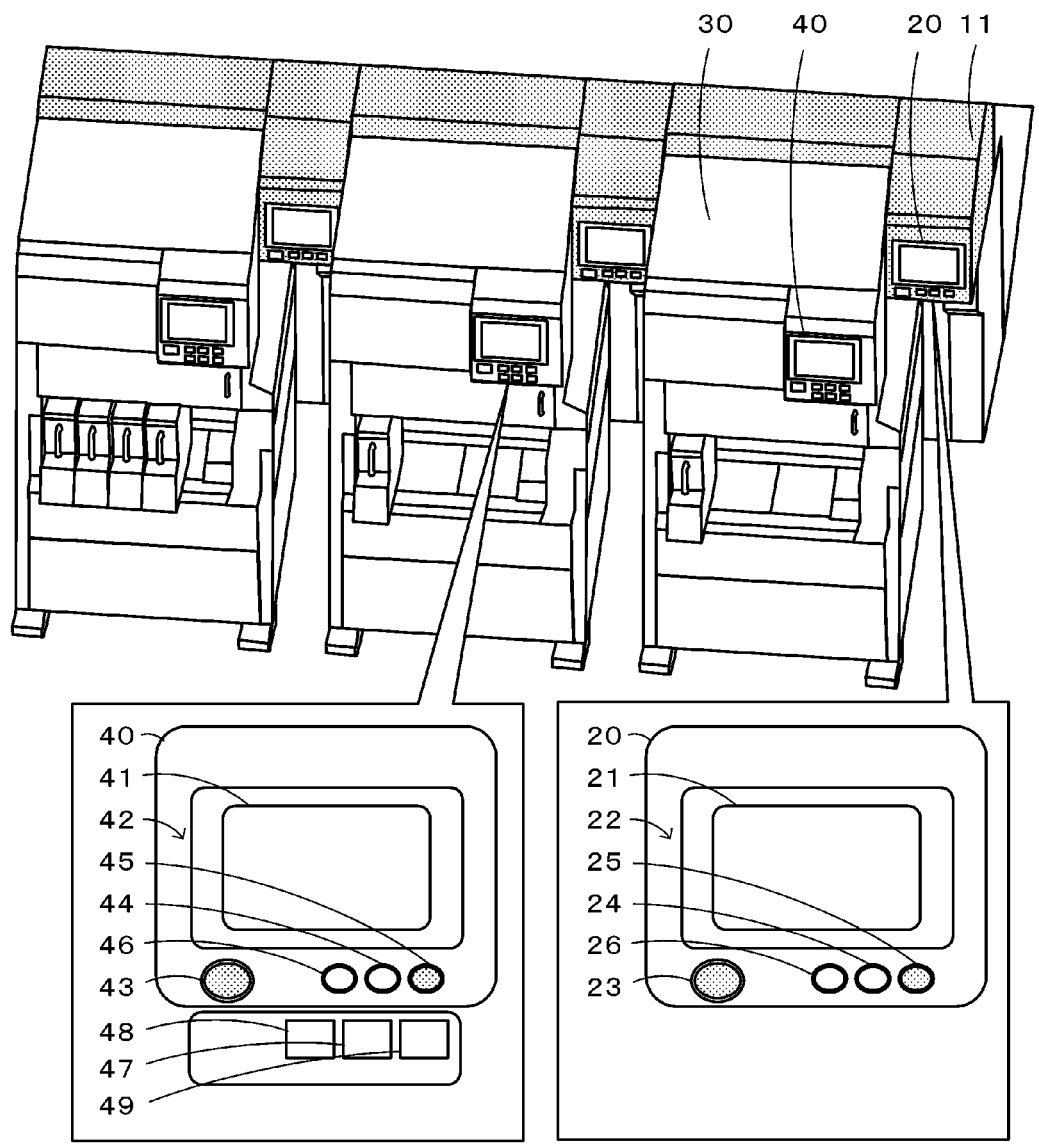
FIG. 2 is a schematic diagram showing an example of main operation panel 20 and unit operation panel 40.

Embodiments of the present disclosure are described below with reference to the drawings. FIG. 1 is a schematic diagram showing an example of a configuration of mounting device 11 and component supply unit 30 of mounting system 10. FIG. 2 is a schematic diagram showing an example of main operation panel 20 of mounting device 11 and unit operation panel 40 of component supply unit 30. Mounting system 10 is a system that executes amounting process related to, for example, a process of mounting a component on a substrate. In mounting system 10, multiple mounting devices 11 for performing mounting processes for mounting components on a substrate are arranged, upstream to downstream, to constitute a production line. In the present embodiment, the left-right direction (i.e., the X-axis), the front-rear direction (i.e., the Y-axis), and the up-and-down direction (i.e., the Z-axis) are as shown in FIG. 1.

As shown in FIG. 1, mounting device 11 includes control unit 12, substrate transport unit 13, mounting unit 14, connecting section 18, main operation panel 20, and component supply unit 30. Control unit 12 is configured as a microprocessor centered around a CPU, and includes a memory unit for memorizing a processing program and various data. Control unit 12 outputs control signals to substrate transport unit 13, mounting unit 14, and component supply unit 30 to control these units. Further, control unit 12 receives signals from mounting unit 14 and component supply unit 30 and controls each unit so as to execute processes corresponding to the signals. Substrate transport unit 13 is a unit for loading, transporting, fixing at a mounting position, and unloading a substrate. Substrate transport unit 13 has two lanes, each lane having a pair of conveyer belts. Substrates are conveyed by the conveyor belts.

Mounting unit 14 performs a mounting process for positioning components collected from component supply unit 30 on a substrate fixed by substrate transport unit 13. Mounting unit 14 includes head moving section 15, mounting head 16, and one or more suction nozzles 17. Head moving section 15 includes a slider that is guided by a guide rail and moves in the X-Y direction, and a motor that drives the slider. Mounting head 16 is detachably attached to the slider and is moved in the X-Y direction by head moving section 15. One or more suction nozzles 17 are removably mounted on a lower surface of mounting head 16. Suction nozzle 17 is a pickup member that picks up components by using pressure, and is removably attached to mounting head 16. Instead of suction nozzle 17, mounting head 16 may be provided with a mechanical chuck for mechanically gripping components. Mounting device 11 includes two mounting units 14 at the front and rear sides of the device main body, and is configured to execute mounting processes at the two lanes in parallel.

Connecting section 18 is a connector electrically connected to component supply unit 30. When connecting section 37 of component supply unit 30 and connecting section 18 of mounting device 11 are connected, exchanging of signals becomes possible between the two connecting sections 37 and 18.

Main operation panel 20 includes display section 21 for displaying a screen, and operation section 22 for receiving an input operation from an operator. Display section 21 is configured as a touch panel liquid crystal display, and displays an operation state and settings of mounting device 11 on the screen, and receives operation input corresponding to positions at which the screen is touched. Operation section 22 includes emergency stop key 23, start input key 24, pause key 25, preparation input key 26, and the like. Emergency stop key 23 is a button for causing an emergency stop of mounting device 11 and component supply unit 30. When emergency stop key 23 is pressed, the power of the entire apparatus is turned off. Start input key 24 is a button for issuing a signal, for example, for starting production of mounting device 11 after any one or more of the following: an emergency stop of mounting device 11 and component supply unit 30, a shortage of components at component supply unit 30, or a changeover operation at supply section 32. The pause key 25 is a button for pausing mounting device 11 and component supply unit 30. When pause key 25 is pressed, mounting device 11 stops the processes currently being executed in a restartable manner and the main power remains on. Preparation input key 26 is a button for creating a production start state by turning on moving power to mounting device 11 and component supply unit 30. Operation input of the entire mounting device 11 is performed through main operation panel 20 by way of individual operation inputs via the keys on the touch panel corresponding to each unit connected to mounting device 11.

Component supply unit 30 is a unit for supplying components to mounting device 11, and is mounted on a loading section (not shown) provided on the front side of mounting device 11. In mounting device 11, component supply unit 30 is mounted on the front and rear sides of the device main body. Each component supply unit 30 includes control unit 31, supply section 32, connecting section 37, and unit operation panel 40. Control unit 31 controls the entire component supply unit 30. Control unit 31 is configured as a microprocessor centered around a CPU, and includes a memory section for memorizing a processing program and various data. Control unit 31 controls supply section 32 in accordance with operation input to supply section 32 from unit operation panel 40. Further, control unit 31 outputs a signal to mounting device 11 via connecting section 37 based on an operation input to mounting device 11 from unit operation panel 40.

Supply section 32 is, for example, a device for supplying a loose component to mounting device 11 in a state in which mounting unit 14 can collect the loose component. Supply section 32 includes accommodating section 33, sub-robot 34, imaging section 35, and supply table 36. Accommodating section 33 is a container for accommodating components in a random orientation in which the positions, directions, and the like are not the same. The supply section 32 has multiple accommodating sections 33 removably disposed on the front face thereof. Sub-robot 34 arranges and moves components into a predetermined direction from the accommodating section 33 to the supply table 36. The sub-robot 34 may pick up and move components by suction, or by grasping the components. Imaging section 35 captures an image of a component in accommodating section 33 or a component collected by sub-robot 34. In supply section 32, sub-robot 34 picks up and arranges the components based on the captured image of imaging section 35. Supply table 36 holds the components moved by sub-robot 34 so that the components can be collected by mounting unit 14. Mounting unit 14 picks up components from supply table 36.

Connecting section 37 is a connector electrically connected to the main body of mounting device 11. Connecting section 37 is arranged at the rear side of housing 39 of component supply unit 30. Housing 39 accommodates supply section 32, and accommodating section 33 is disposed on the front thereof. Housing 39 has a height, a depth, and a width that prevents an operator from accessing main operation panel 20 when component supply unit 30 is disposed on the loading section of mounting device 11, as shown in FIG. 2. For example, as shown in FIG. 1, housing 39 has a width W2 that is 60% or more, 70% or more, or even 80% or more of width W1 of mounting device 11. Further, housing 39 has a depth L, such as 50 cm, 60 cm, or 80 cm, that is longer than the length of a hand of an operator. Further, housing 39 has a height H which is about the same as or higher than the height of main operation panel 20. In mounting device 11, when multiple of the component supply units 30 are arranged in a line to form a production line with component supply units 30 loaded, access to main operation panel 20 by an operator is prevented, as shown in FIGS. 1 and 2.

Unit operation panel 40 performs, through an operator, operation input to supply section 32 and operation input to the main body of mounting device 11. Unit operation panel 40 has keys similar to the keys of main operation panel 20. Unit operation panel 40 includes display section 41 for displaying a screen and operation section 42 for receiving an input operation from an operator. Operation section 42 includes emergency stop key 43, start input key 44, pause key 45, preparation input key 46, and the like. Emergency stop key 43 is a button for causing an emergency stop of mounting device 11 and component supply unit 30. Start input key 44 is a button for issuing a signal, for example, for starting production of mounting device 11 after any one or more of the following: an emergency stop of mounting device 11 and component supply unit 30, a shortage of components at component supply unit 30, a changeover operation at supply section 32. Pause key 45 is a button for pausing mounting device 11 and component supply unit 30. Preparation input key 46 is a button for creating a production start state by turning on moving power to mounting device 11 and component supply unit 30. These keys have the same arrangement, size, and function as the keys of main operation panel 20, thereby preventing an operator from erroneously performing an operation. With the above unit operation panel. 40, an individual operation input to each configuration item of component supply unit 30 is performed via the touch panel and an operation input for the overall mounting device 11 is performed by operating the above described input keys.

Start input key 47, preparation input key 48, and lock release key 49 for operating component supply unit 30 are provided on a lower section of unit operation panel 40. Start input key 47 is a button for issuing a signal for starting component supply operation of supply section 32. Preparation input key 48 is a button for turning on the moving power of supply section 32 so supply section 32 can supply components. Lock release key 49 is a button for releasing a lock of component door 38 of supply section 32. When the lock release key 49 is pressed, the component door 38 can be opened and closed, such that the operator can open component door 38 to replenish accommodating section 33 with components.

Figure 3:
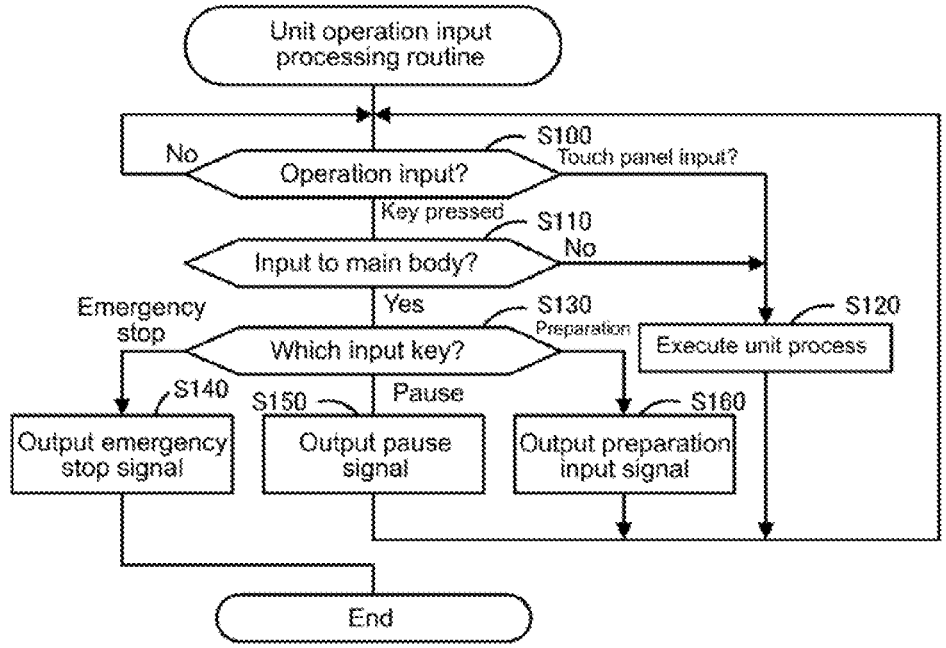
FIG. 3 is a flowchart showing an example of a unit operation input processing routine.

Next, an operation of mounting device 11, according to the present embodiment configured as described above, beginning with the process of receiving an operation input from an operator through unit operation panel 40, will be described. FIG. 3 is a flowchart showing an example of a unit operation input processing routine executed by control unit 31 of component supply unit 30. The routine is memorized in the memory section of control unit 31, and is executed by control unit 31 after the main power supply of component supply unit 30 is turned on.

When the routine is started, control unit 31 first determines whether there is an operation input at unit operation panel 40 (step S100). When there is no operation input, control unit 31 repeats the process (step S100) until there is an operation input. On the other hand, when there is an input from a key of unit operation panel 40, control unit 31 determines whether the input is an input to the main body (step S110). This determination is made based on whether any of the keys disposed below display section 41 have been pressed. When the key input is not an input to the main body, or when it is determined in step S100 that the input was made from display section 41 of unit operation panel 40 via the touch panel, control unit 31 executes a process corresponding to component supply unit 30 (step S120), and repeatedly executes step S100 and subsequent steps. Processes of component supply unit 30 include, for example, checking the operation of supply section 32 (e.g., sub-robot 34 and imaging section 35).

On the other hand, when in step S110 the key input is an input to the main body, control unit 31 determines which key was pressed (step S130). When the key input is emergency stop key 43, control unit 31 outputs an emergency stop signal to mounting device 11 via connecting section 37 and connecting section 18, then ends the routine (step s140). On the other hand, when the key input is determined in step S130 to be pause key 45, control unit 31 outputs a pause signal to mounting device 11 (step S150). When the key input is determined in step S130 to be preparation input key 46, the control unit 31 outputs a preparation input signal to mounting device 11 (step S160). Then, after steps S150, S160, and S120, control unit 31 repeatedly executes the processes after step S100. In this manner, the operator can perform operation input to component supply unit 30 from unit operation panel 40 and also perform operation input to mounting device 11 from unit operation panel 40.

Figure 4:
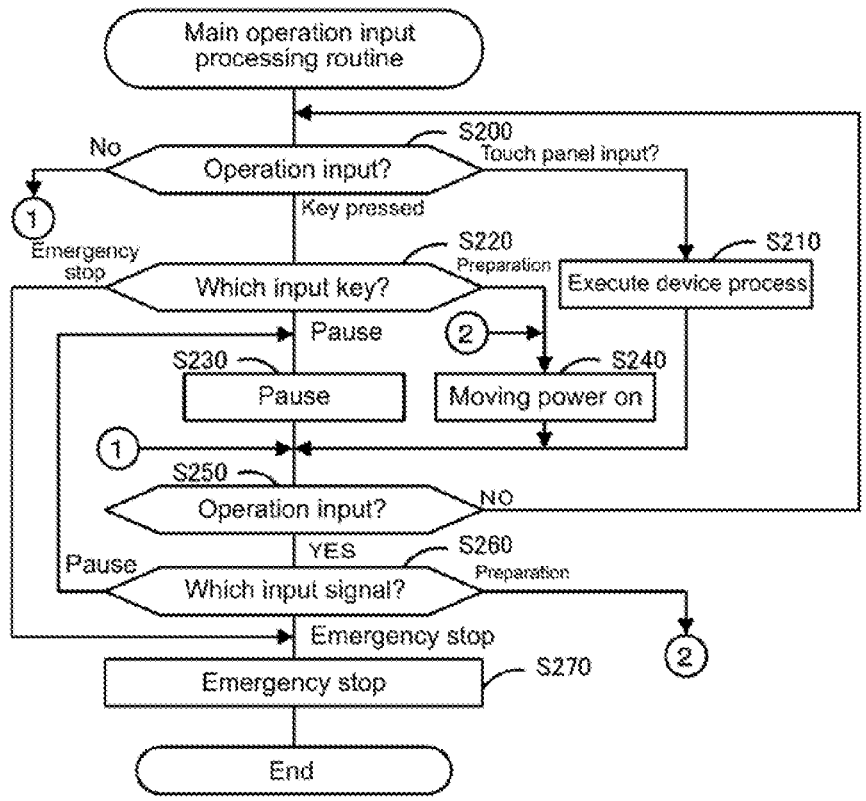
FIG. 4 is a flowchart showing an example of a main operation input processing routine.

Next, a process of receiving an operation input by an operator from main operation panel 20 will be described. FIG. 4 is a flowchart showing an example of a main operation input processing routine executed by control unit 12 of mounting device 11. This routine is memorized in the memory section of control unit 12 and is executed by control unit 12 after the main power of mounting device 11 is turned on. When the routine is started, control unit 12 first determines whether there is an operation input to main operation panel 20 (step S200), and when an input has been made on the touch panel of display section 21 of main operation panel 20, control unit 12 executes the corresponding process in mounting device 11 (step S210). Processes of mounting apparatus 11 include, for example, confirming the operation of the control unit, substrate transport unit 13, mounting unit 14, and the like.

On the other hand, when there is a key input to the main operation panel 20 in step S200, control unit 12 determines which key was pressed (step S220). When the key input is pause key 25, control unit 12 pauses the process being executed by mounting device 11 with the main power remaining on (S230). When the key input is determined in step 220 to be preparation input key 26, control unit 12 turns on moving power to the respective units and puts the units into a production start state (step S240). After steps S230, S240, and S210, or when there is no operation input at step S200, control unit 12 determines whether a signal is being inputted from component supply unit 30 (step S250), and when no signal is being inputted, control unit 12 repeatedly executes the processes after step S200.

On the other hand, when a signal is being inputted from component supply unit 30 at step S250, the control unit 12 determines which of the input signals was inputted (step S260). When the input signal is a pause signal, control unit 12 executes the processes after step S230. Further, when the input signal is a preparation input signal, control unit 12 executes the processes of step S240 and subsequent steps. On the other hand, when the input signal is an emergency stop signal or when a key input is received from emergency stop key 23 in step S220, control unit 12 turns off the main power source of mounting device 11 and the power of component supply unit 30 and the like to perform an emergency stop (step S270), then ends the routine. In this manner, mounting device 11 controls the entire mounting device 11 based on inputs from main operation panel 20 and unit operation panel 40.

When, for example, an error occurs at mounting device 11, the operator presses emergency stop key 43 of unit operation panel 40 to temporarily stop mounting device 11. After releasing the key, the operator presses start input key 44 of unit operation panel 40 to resume the mounting process of mounting device 11. When a component shortage occurs at component supply unit 30, the operator moves to component supply unit 30, checks unit operation panel 40, and presses pause key 45 to pause mounting device 11. After replenishing the components, the operator presses start input key 44 to resume the mounting process of mounting device 11. When changeover is to be performed at mounting device 11, the operator sets parts and tools while viewing display section 41 of unit operation panel 40. When the changeover is complete, start input key 44 of unit operation panel 40 is pressed to start production of the substrate. In this manner, the operator can stop the mounting device 11 and start the mounting process from unit operation panel 40 without accessing main operation panel 20.

Here, correspondences between constituent elements of the present embodiment and constituent elements of the present disclosure will be clarified. Control unit 31 of the present embodiment corresponds to a control unit, supply section 32 corresponds to a supply section, unit operation panel 40 corresponds to a unit operation panel, and housing 39 corresponds to a housing.

Component supply unit 30 of the present embodiment described above includes supply section 32 for supplying components to mounting device 11, is electrically connected to mounting device 11, receives from an operator an operation input to supply section 32 and an operation input to mounting device 11, controls supply section 32 in accordance with the operation input to supply section 32, and outputs signals to mounting device 11 based on the operation input to mounting device 11. As described above, with this unit, because it is possible for mounting device 11 to receive an operation input, mounting device 11 can be operated from component supply unit 30 without the operator accessing the mounting apparatus 11. As a result, the operator can perform operations in a smooth manner. Further, component supply unit 30 has start input key 44 for issuing a signal for starting production of mounting device 11 such that production of mounting device 11 resumes from component supply unit 30 after an operation of component supply unit 30, such as after an emergency stop, after a component supply shortage, or after changeover, so that the operator can start production smoothly.

Unit operation panel 40 has emergency stop key 43, start input key 44, pause key 45, and preparation input key 46. For this reason, it is efficient to perform an input operation from the component supply unit 30 side. Thus, an input operation to set mounting device 11 into an emergency stop state, a pause state, or a preparation state can be performed from the component supply unit 30 side. Furthermore, since component supply unit 30 is provided with a housing having a height, a depth, and a width that prevents the operator from accessing main operation panel 20 when component supply unit 30 is loaded on the loading section of mounting device 11, access to main operation panel 20 is blocked by component supply unit 30. However, the operator can operate mounting device 11 from unit operation panel 40 of component supply unit 30. Furthermore, with component supply unit 30, since unit operation panel 40 is provided with a start input key, an emergency stop key, a pause key, a preparation input key, and the like, which are the same as the various keys provided on main operation panel 20 of the mounting apparatus 11, erroneous operation by the operator is less likely to occur.

Note that, the present disclosure is not limited to the above-described embodiment and may be implemented in various modes that fall within the technical scope of the present disclosure.

For example, in the embodiment described above, unit operation panel 40 has emergency stop key 43, start input key 44, pause key 45, and preparation input key 46, which are the same as those of main operation panel 20, but the configuration is not particularly limited thereto, and any one or more of the keys may be omitted. Although main operation panel 20 has emergency stop key 23, start input key 24, pause key 25, and preparation input key 26, one or more of them may be omitted, or keys having different functions may be added. Furthermore, although unit operation panel 40 has start input key 47, preparation input key 48, and lock release key 49, one or more of them may be omitted, or keys having different functions may be added. In the embodiment described above, the input key is a button to be pressed, but is not particularly limited thereto, and may be, for example, an input key that is an image displayed on display section 21 or display section 41, that is, an input key on a touch panel.

In the above-described embodiment, component supply unit 30 is provided with housing 39 having a size that prevents the operator from accessing main operation panel 20, but the configuration is not particularly limited thereto. For example, even in a case in which an operator can access main operation panel 20, the operator can perform operations more smoothly because operations to start the device, start production, and the like can be entered at unit operation panel 40 directly after operations of component supply unit 30.

In the above-described embodiment, component supply unit 30 has loose components arranged in a collectable manner, but the configuration is not particularly limited thereto. For example, another component supply unit supplying other components, such as electronic components supplied from tape by a feeder or die components obtained by dicing a wafer, may be used. In this case, it is more applicable if the component supply unit is configured such that it is difficult for an operator to access the main operation panel when the component supply unit is loaded on mounting device 11. This is because operation input to mounting device 11 can be performed from the unit operation panel of the component supply unit.

Descriptions were given with regard to mounting device 11 in the above-described embodiment, but the configuration is not particularly limited thereto, and may be applied as component supply unit 30 provided with unit operation panel 40.

INDUSTRIAL APPLICABILITY

The present disclosure can be applied to the mounting of electronic components.

DESCRIPTION OF REFERENCE NUMERALS 10 mounting system, 11 mounting apparatus, 12 control unit, 13 substrate transport unit, 14 mounting unit, 15 head moving section, 16 mounting head, 17 suction nozzle, 18 connecting section, 20 main operation panel, 21 display section, 22 operation section, 23 emergency stop key, 24 start input key, 25 pause key, 26 preparation input key, 30 component supply unit, 31 control unit, 32 supply section, 33 accommodating section, 34 sub-robot, 35 imaging section, 36 supply table, 37 connecting section, 38 component door, 39 housing, 40 unit operation panel, 41 display section, 42 operation section, 43 emergency stop key, 44 start input key, 45 pause key, 46 preparation input key, 47 start input key, 48 preparation input key, 49 lock release key.

The invention claimed is:

1. A component supply unit configured to be loaded on a mounting device for mounting a component on a substrate, the component supply unit comprising:
   a supply section including a supply table that is configured to supply a component to the mounting device;
   a component supply unit connector configured to be electrically connected to the mounting device;
   a unit operation panel configured to receive from an operator an operation input to the supply section and an operation input to the mounting device, and
   an electronic control unit configured to control the supply section in accordance with the operation input to the supply section and to output a signal to the mounting device based on the operation input to the mounting device, wherein the mounting device includes a main operation panel to perform operation input to the mounting device, two or more of which can be lined up to form a production line, the component supply unit includes a housing having a height, a depth, and a width to prevent an operator from accessing the main operation panel when the component supply unit is loaded on the loading section of the mounting device, and the housing accommodates the supply section.

2. The component supply unit according to claim 1, wherein the unit operation panel has a start input key configured to issue a signal for starting production of the mounting apparatus after any one or more of conditions of:

an emergency stop of the mounting apparatus and the component supply unit;

a component shortage of the component supply unit, and a changeover operation at the supply section.

3. The component supply unit according to claim 1, wherein the unit operation panel includes at least one of an emergency stop key configured to cause an emergency stop of the mounting apparatus and the component supply unit, a pause key configured to pause the mounting device and the component supply unit, and a preparation input key configured create a preparation state by turning on moving power to the mounting device and the component supply unit.

4. The component supply unit according to claim 1, wherein the main operation panel includes one or more of:

a start input key configured to issue a signal for starting production of the mounting device after any one or more of conditions of: an emergency stop of the mounting apparatus and the component supply unit, a component shortage of the component supply unit, and a changeover operation at the supply section;

a pause key configured to pause the mounting device and the component supply unit; and a preparation input key configured to create a production start state by turning on moving power to the mounting device and the component supply unit.

5. The component supply unit according to claim 1, wherein the unit operation panel includes at least one of a preparation input key configured to make component supply possible by turning on moving power to the supply section, a start input key configured to cause the supply section to start component supply, and a lock release key configured to release a lock of a component door of the supply section.

6. A mounting device comprising:

the component supply unit according to claim 1;

a mounting device connector configured to be electrically connected to the component supply unit;

a mounting unit configured to mount a component collected from the component supply unit on a substrate; and an electronic control device configured to receive a signal from the component supply unit, which controls the mounting unit.

\* \* \* \* \*